United States Patent [19]
Ayasli

[11] Patent Number: 4,486,719
[45] Date of Patent: Dec. 4, 1984

[54] DISTRIBUTED AMPLIFIER

[75] Inventor: Yalçin Ayasli, Waltham, Mass.

[73] Assignee: Raytheon Company, Lexington, Mass.

[21] Appl. No.: 394,242

[22] Filed: Jul. 1, 1982

[51] Int. Cl.³ .............................................. H03F 3/60
[52] U.S. Cl. ..................................... 330/286; 330/54; 330/277
[58] Field of Search .................... 330/53, 54, 277, 286

[56] References Cited
FOREIGN PATENT DOCUMENTS
280348  4/1970  Austria .................................. 330/54

OTHER PUBLICATIONS

"Charge-Sensing Preamplifier for Semiconductor Nuclear Detectors and High-Capacitance Photoreceivers", Levchenko et al., Physiotechnical Institute, Academy of Sciences of USSR, Sep.-Oct. 1975.
"Transistorized Distributed Amplifier" by C. W. McMullen, The Review of Scientific Instruments, vol. 30, No. 12, Dec. 1959.
"GaAs FET Distributed Amplifier", by J. A. Archer, F. A. Petz and H. P. Weidlich, Electronics Letters, Jun. 1981, No. 13, p. 433.

Primary Examiner—James B. Mullins
Assistant Examiner—G. Wan
Attorney, Agent, or Firm—Denis G. Maloney; Richard M. Sharkansky; Joseph D. Pannone

[57] ABSTRACT

A distributed amplifier having a plurality of successively coupled field effect transistors with cascaded gate electrodes and cascaded drain electrodes. A first one of such transistors has the gate electrode thereof coupled to an input terminal adapted to receive an input radio frequency signal and the drain electrode thereof coupled to a dc drain electrode bias circuit. The last one of the successively coupled field effect transistors has the gate electrode thereof coupled to a dc gate electrode bias circuit and a drain electrode coupled to a radio frequency output terminal which produces an amplified radio frequency signal. The source electrodes of the plurality of transistors are coupled to ground. A drain bias voltage source is coupled between ground and the drain electrode bias circuit, such bias circuit providing a direct current path between such drain bias voltage source and the drain electrodes of the transistors. The drain electrode dc bias circuit has a complex impedance with the real component thereof being provided, in part, by a resistor in such bias circuit. The resistor is coupled in series with a grounded high frequency by-pass capacitor and, hence, is not in the direct current path between the drain bias voltage source and the drain electrodes, but rather is in the radio frequency signal path to ground. With such arrangement, only a relatively small amount of dc power is dissipated by the resistor in such drain biasing circuit.

10 Claims, 7 Drawing Figures

DISTRIBUTED AMPLIFIER

The Government has rights in this invention pursuant to Contract No. F33615-81-C-1413 awarded by the Department of the Air Force.

BACKGROUND OF THE INVENTION

This invention relates generally to radio frequency amplifiers and, more particularly, to radio frequency amplifiers having a plurality of cascade coupled field effect transistors arranged to provide a distributed amplifier.

As is known in the art, radio frequency amplifiers configured as distributed amplifiers having a plurality of cascade interconnected field effect transistors have been suggested to provide amplification of radio frequency signals. One such amplifier has been discussed in an article entitled "GaAs FET Distributed Amplifier," by J. A. Archer, F. A. Petz and H. P. Weidlich, published June 1981, No. 13, p. 433 in Electronics Letters. In such amplifier, biasing of the transistors therein is provided by coupling a direct current (dc) source to the output terminal of the amplifier through an inductor, such inductor providing a high impedance to radio frequency (RF) energy fed to the output port to thereby isolate the dc source from the RF energy while allowing a direct current (dc) path from the dc bias voltage source to the transistors. With such arrangement, however, when used with radio frequency signals over a relatively wide band of frequencies, a relatively large inductor would be required to provide the desired isolation and such inductor is difficult to realize. Further, in order to provide an amplifier adapted to operate over a relatively wide band of radio frequencies, it is desirable to fabricate the amplifier as a monolithic integrated circuit; that is, with the transistors and their electrical interconnects being formed on a single substrate, such as a gallium arsenide substrate. Thus, the use of a relatively large inductor for the biasing circuit to provide RF energy isolation to the dc bias source also makes the use of such inductor impractical for monolithic integrated circuit fabrication. Further, in order to meet requirements of a relatively wide bandwidth, it is also necessary that the biasing circuit provide smooth and well-controlled impedance variations over the band of frequencies to thereby optimize the amplifier design characteristics over such operating bandwidth.

Another distributed amplifier is discussed in an article entitled "Transistorized Distributed Amplifier" by C. W. McMullen published in *The Review of Scientific Instruments*, Vol. 30, No. 12, Dec. 1959. Here a dc biasing network is shown for the cascaded transistors in such amplifier. The transistors, here bipolar transistors, have their collector electrodes coupled to a DC voltage source input terminal through a resistor included in such bias network. The dc voltage source input terminal is also coupled to ground through a capacitor which provides a low impedance path for the radio frequency energy to provide some degree of isolation between the dc bias voltage source and the RF signals. With such arrangement, however, direct current passes through the resistor thereby causing dc power dissipation.

SUMMARY OF THE INVENTION

In accordance with the present invention, a plurality of successively coupled field effect transistors having cascade electrically interconnected gate electrodes and cascade electrically interconnected drain electrodes is provided. A first one of such transistors has the gate electrode thereof coupled to an input terminal adapted to receive an input radio frequency signal and the drain electrode thereof coupled to a dc drain electrode biasing circuit. A succeeding one of the successively coupled plurality of transistors has its gate electrode coupled to a dc gate electrode bias circuit and a drain electrode coupled to a radio frequency output terminal which produces an amplified radio frequency signal. The source electrodes of the plurality of transistors are connected to a reference potential, typically ground potential. A gate electrode bias voltage source is connected between ground and the gate electrode dc bias circuit. The gate electrode dc bias circuit provides a direct current path between such gate electrode bias voltage source and the gate electrodes of the transistors and includes radio frequency (RF) by-pass capacitors to provide a low impedance path to the radio frequency signals in such circuit and ground potential to thereby direct such RF signals to ground. A drain bias voltage source is coupled between ground potential and the drain electrode bias circuit, such bias circuit providing a direct current path between such drain bias voltage source and the drain electrodes of the transistors. The gate electrode bias circuit includes a capacitor for providing a relatively low impedance between radio frequency signals in such second bias circuit and ground potential to thereby direct such RF signals to ground. Both the gate electrode and the drain electrode dc bias circuits have an impedance with both a real and an imaginary component, such real component being provided in some measure by resistors in such circuits. While the resistor in the gate electrode bias circuit is in series with the gate bias voltage source and gate electrodes of the transistors, since such transistors are field effect transistors there is effectively zero direct current passing through such resistor and, hence, relatively little, if any, dc power dissipation by such gate electrode bias circuit. Further, the drain electrode dc bias circuit also has an impedance with both a real component and an imaginary component, the real component being provided in part by the resistor in such circuit. However, such resistor is coupled in series with the high frequency by-pass capacitor and is not in the direct current path between the drain bias voltage source and the drain electrodes, but rather is in the radio frequency signal path to ground. Thus, no dc power is dissipated by the resistor in such drain biasing circuit. The impedances of the gate electrode and drain electrode bias circuits are selected in accordance with the impedances of the cascaded transistors which include inherent capacitances of such transistors and the impedances of the interconnecting transmission lines, to provide such amplifier with optimum impedance characteristics over the operating band. With such arrangement, dc biasing circuits are provided which: enable optimum amplifier performance over the operating band; isolation of the dc bias source from the radio frequency signals; allow direct current bias voltage source to be coupled to such transistor to bias such transistor to provide the desired gain to the RF signals to passing therethrough but without substantial bias circuit dc power dissipation; and to provide components for such biasing circuit which enable the distributed amplifier to be fabricated using conventional monolithic integrated circuit fabrication techniques.

BRIEF DESCRIPTION OF THE DRAWINGS

The above-mentioned and other features of the invention will become more apparent by reference to the following description taken in connection with the accompanying drawings in which.

DESCRIPTION OF THE PREFERRED EMBODIMENTS

Figures 1, 2:
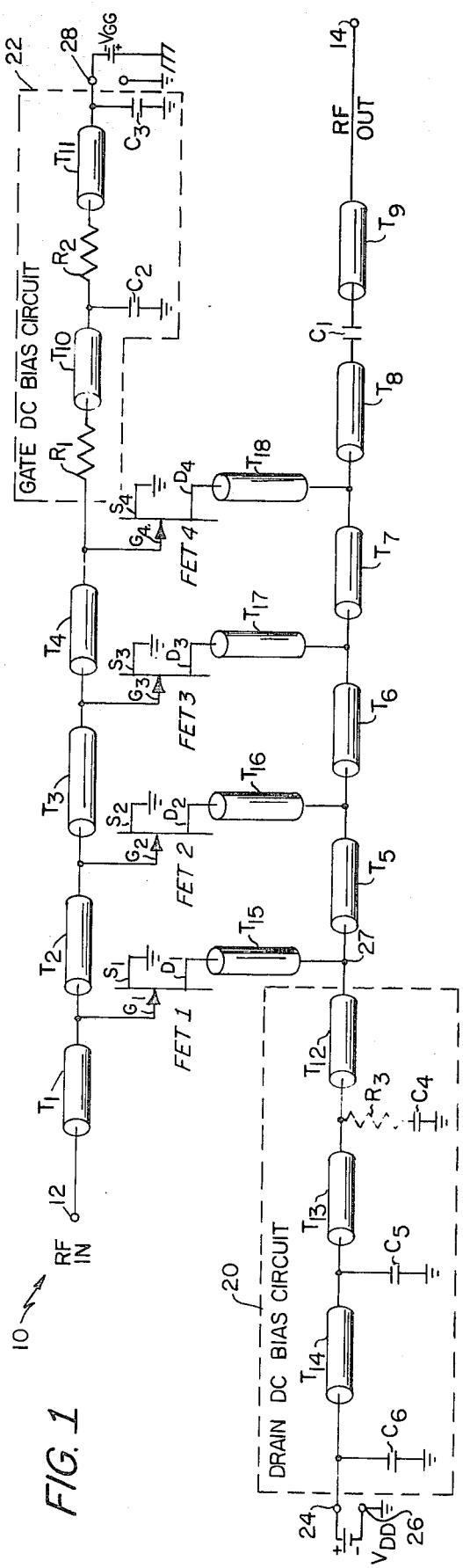
FIG. 1 is a schematic diagram of a distributed amplifier having biasing circuits according to the invention.
FIG. 2 is a schematic diagram of an equivalent circuit, somewhat simplified, of the distributed amplifier of FIG. 1.

Referring now to FIG. 1, a distributed amplifier 10 is shown to include a plurality of, here four, field effect transistors (FET 1, FET 2, FET 3, FET 4) successively coupled between an RF input port 12 and an RF output port 14 to provide amplification of radio frequency signals fed to input port 12, such amplified radio frequency signals appearing at output port 14. The field effect transistors (FET 1 to FET 4) are here metal electrode semiconductor field effect transistors (MESFET). The field effect transistors FET 1 to FET 4 have input electrodes, here gate electrodes $G_1$ to $G_4$, respectively, cascade electrically interconnected via transmission lines, here microstrip transmission lines $T_2$, $T_3$, $T_4$, respectively as indicated. The output electrodes, here drain electrodes $D_1$, $D_2$, $D_3$ and $D_4$ of such field effect transistors FET 1 to FET 4, respectively, are cascade electrically interconnected via transmission lines, here microstrip transmission lines $T_5$, $T_6$, $T_7$, $T_{15}$, $T_{16}$, $T_{17}$, $T_{18}$ as shown. The source electrodes $S_1$ to $S_4$ of transistors FET 1 to FET 4, respectively, are connected to a reference potential, here ground, as shown. The gate electrode of the first one of the field effect transistors, here the gate electrode $G_1$ of transistor FET 1 is connected to input port 12 through a transmission line, here a microstrip transmission line $T_1$. The output electrode (i.e. drain electrode $D_1$) of the first field effect transistor FET 1 is coupled to a drain dc bias circuit 20, as shown. A succeeding one of the field effect transistors, here the last (or fourth) field effect transistor FET 4, has its input, or gate, electrode $G_4$ connected to a gate dc bias circuit 22 as shown, and the output (or drain) electrode $D_4$ of such transistor FET 4 is connected to the output terminal 14 through transmission line $T_{18}$ and serially coupled transmission line $T_8$, dc blocking capacitor $C_1$, and transmission line $T_9$, (here such transmission lines $T_8$ and $T_9$ also being microstrip transmission lines).

The drain bias circuit 20 is here a ladder network having three shunt paths to ground via capacitors $C_4$, $C_5$, $C_6$ with transmission lines (here microstrip transmission lines) $T_{12}$, $T_{13}$ and $T_{14}$ as series elements of such ladder network. Input terminals 24, 26 are adapted for coupling to a drain electrode dc bias source, $V_{DD}$, such terminal 26 being connected to ground and terminal 24 being connected to capacitor $C_6$ and transmission line $T_{14}$, as shown. Capacitors $C_4$, $C_5$ and $C_6$ provide relatively low impedance to radio frequency (RF) signals and thus shunt such radio frequency signals to ground to prevent such RF signals from being coupled to the dc bias source, $V_{DD}$, thereby isolating such dc bias source, $V_{DD}$, from such radio frequency signals. However, a direct current (dc) path is provided through transmission lines $T_{12}$, $T_{13}$, $T_{14}$. Thus, direct current from the drain bias source is allowed to pass from terminal 24, through the strip conductors of microstrip transmission lines $T_{14}$, $T_{13}$, $T_{12}$ to output terminal 27 of such bias circuit 20 and then to the drain electrodes $D_1$ to $D_4$ through the strip conductors of transmission lines $T_{15}$, $T_{16}$, $T_{17}$, $T_{18}$ and $T_5$, $T_6$, $T_7$ and then return to ground through the ground source electrodes $S_1$ to $S_4$. It is noted that the shunt path which includes capacitor $C_4$ also includes a serially connected resistor $R_3$. It is noted, however, that a direct current path is not provided to ground through resistor $R_3$, and hence no direct current power is dissipated by resistor $R_3$.

The gate bias circuit 22 is also a ladder network and includes serially connected resistor $R_1$ and transmission line $T_{10}$ (here a microstrip transmission line), a second resistor $R_2$ and a second transmission line $T_{11}$ (here also a microstrip transmission line) to provide a direct current path between the gate electrode $G_4$ and a gate bias voltage $V_{GG}$. It is noted that, while resistors $R_1$ and $R_2$ are a direct current path between terminal 28 and the gate electrodes of transistors FET 1 to FET 4 since there is very small current flow through the gate electrodes, there is little direct current power dissipated by such resistors. Here again, radio frequency bypass capacitors $C_2$, $C_3$ provide a low impedance path to radio frequency signals in such circuit 22 to shunt such radio frequency signals to ground. Thus, the voltage $V_{GG}$ is dc coupled to the gate electrodes $G_1$ to $G_4$ by the strip conductors of microstrip transmission lines $T_2$, $T_3$, $T_4$, $T_{10}$, $T_{11}$ and resistors $R_1$, $R_2$.

Referring now to FIG. 2, it is noted that the equivalent circuit of the distributed amplifier 10 includes the inherent capacitance between the gate and source electrodes of each of the field effect transistors FET 1 to FET 4 as represented by capacitors $C_{gs1}$ to $C_{gs4}$ and the gate resistance $R_{G1}$ to $R_{G4}$, respectively. Also included are the drain resistances $R_{D1}$ to $R_{D4}$ of such transistors FET 1 to FET 4, respectively, and the inherent drain-to-source capacitances, $C_{DS1}$ to $C_{DS4}$, respectively, of such transistors. It is noted that each field effect transistor includes in the equivalent circuit thereof, a current source which produces a current $g_m e$, where $g_m$ is the transconductance of such transistor and e is the voltage across the source-gate capacitance $C_{gs}$ of such transistors. The characteristic impedances of transmission lines $T_2$, $T_3$, $T_4$ are selected in accordance with the gate-to-source capacitances $C_{gs1}$ to $C_{gs4}$ and the gate resistances $R_{g1}$ to $R_{g4}$ to provide a ladder network 30 with an input impedance matched to the input impedance of transmission line $T_1$, here 50 ohms. It is noted that network 30 appears somewhat as an artificial line except that, instead of having inductors in the series legs of such artificial line, network 30 includes microstrip transmission lines as discussed in my copending patent application Ser. No. 247,678, filed March 26, 1981, and assigned to the same assignee as the present invention. It is also noted that the impedance of the network 30 is a function of impedance of biasing networks 20, 22 which are here required to be complex to provide optimum performance over the operating bandwidth. The real portion of such complex impedance is provided, in part, by resistors $R_1$, $R_2$ and $R_3$.

Figure 4:
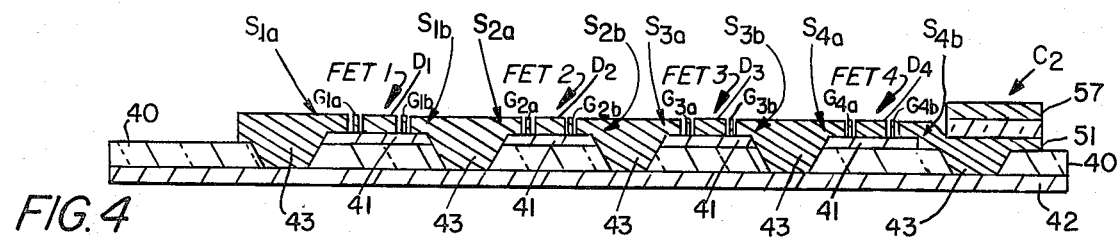
FIG. 4 is a cross-sectional view of the monolithic integrated circuit of FIG. 3, such cross-section being taken along line 4—4.
Figure 3:
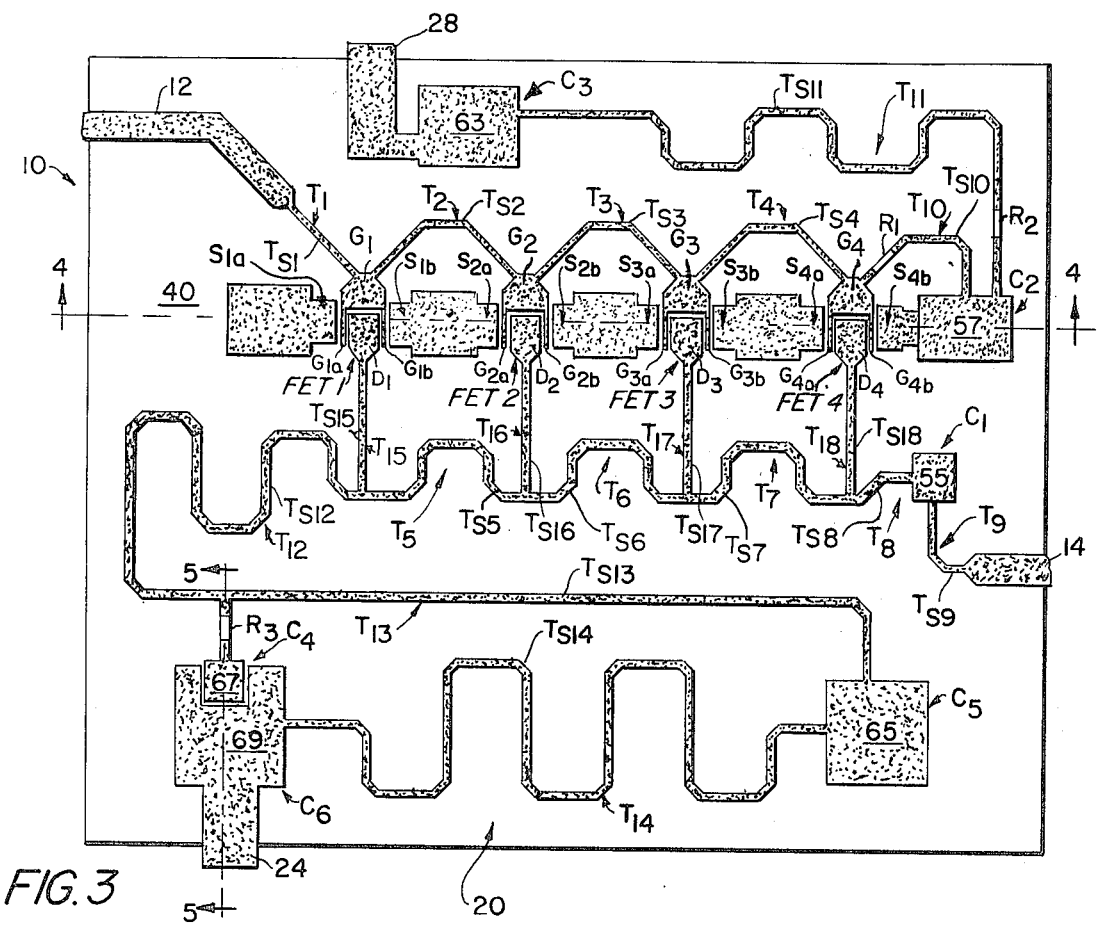
FIG. 3 is a plan view of the distributed amplifier of FIG. 1 fabricated as a monolithic integrated circuit.
Figure 5:
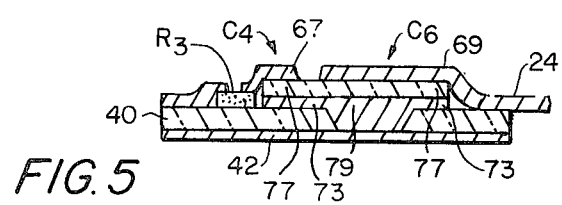
FIG. 5 is a cross-section of a portion of the monolithic integrated circuit of FIG. 3, such cross-section being shown along line 5—5.
Figure 6:
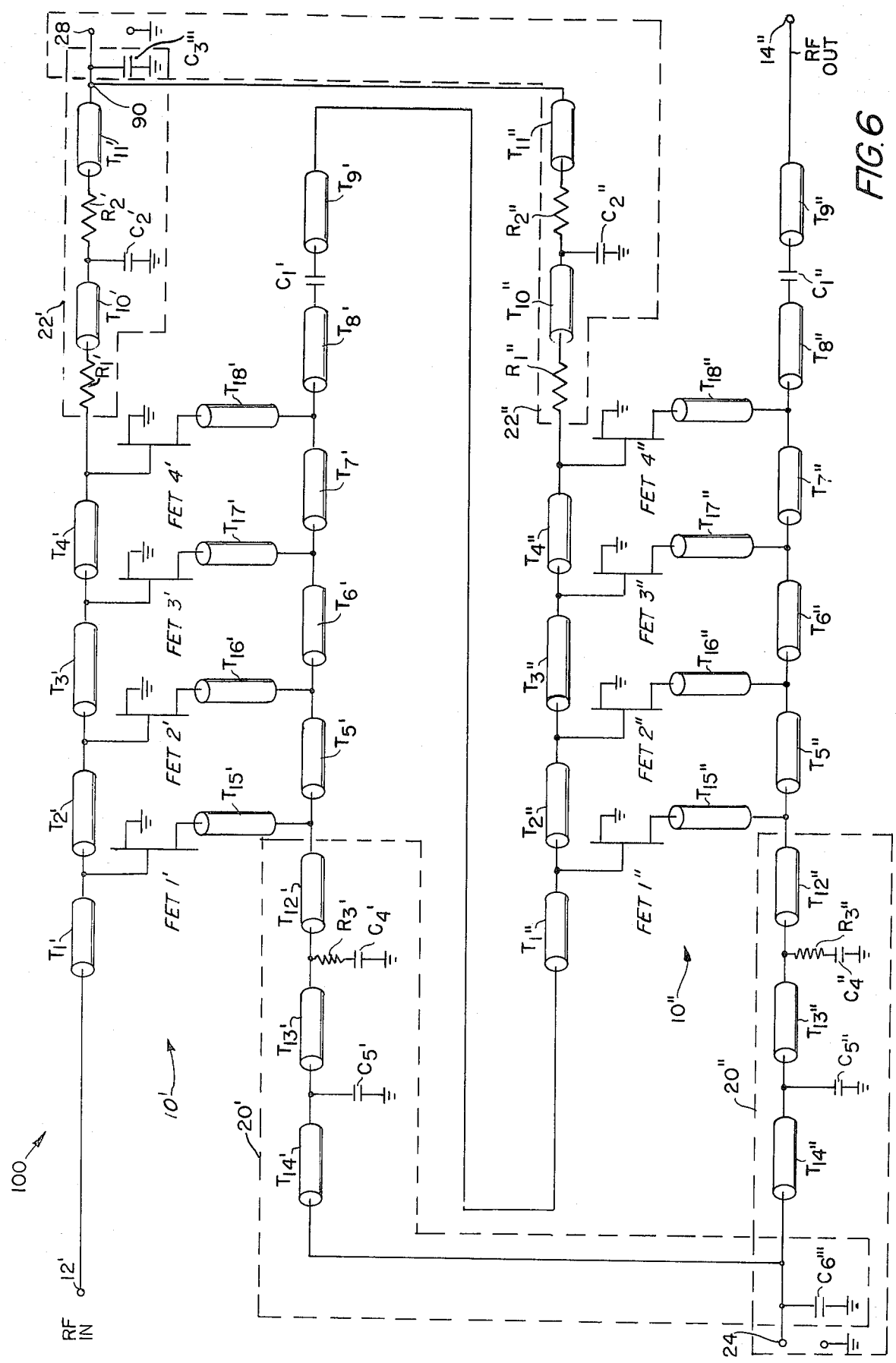
FIG. 6 is a schematic diagram of a distributed amplifier according to an alternate embodiment of the invention.

Referring now to FIGS. 4, 5 and 6, the distributed amplifier 10 is shown as a monolithic integrated circuit, such amplifier being formed on a gallium arsenide substrate 40 having a ground plane conductor 42 (FIG. 4) formed on the bottom surface thereof and mesa-shaped epitaxial layer 41 formed on a portion of the upper surface of substrate 40 to provide the active regions for the transistors FET 1 to FET 4. The source electrodes are electrically connected to the ground plane conductor 42 by conductors 43 passing through vias as described in my patent application referred to above. Further, each one of the field effect transistors FET 1 to FET 4 is identical in construction, each one thereof having a drain electrode $D_1$ to $D_4$, respectively, pairs of gate electrodes $G_{1a}$, $G_{1b}$ to $G_{4a}$, $G_{4b}$ connected to common gate pads $G_1$ to $G_4$, respectively, as shown in FIG. 3, and pairs of source contacts $S_{1a}$, $S_{1b}$ to $S_{4a}$, $S_{4b}$, respectively, as shown, each pair of source contacts $S_{1a}$, $S_{1b}$ to $S_{4a}$, $S_{4b}$ being represented as source electrodes $S_1$ to $S_4$, respectively, in FIG. 1. Thus, considering an exemplary one of such field effect transistors FET 1 to FET 4, here FET 1, such transistor is shown to have a common drain contact $D_1$ and a pair of source contacts $S_{1a}$, $S_{1b}$ separated from the drain contact $D_1$ by a pair of gate electrodes $G_{1a}$, $G_{1b}$, as shown. The gate electrodes $G_{1a}$ and $G_{1b}$ are connected together at gate contact, here, and in the schematic of FIG. 1, indicated by the designation "$G_1$". It is noted that source contacts $S_{1a}$ and $S_{1b}$ are electrically interconnected through conductors 43 passing through vias which pass through the epitaxial layer 41 and substrate 40 to the ground plane conductor 42. It is noted that transmission lines $T_1$ to $T_{18}$, as noted in connection with FIG. 1, are microstrip transmission lines formed by ground plane 42, the dielectric provided by the semi-insulating gallium arsenide substrate 40, and strip conductors $T_{1s}$ to $T_{18s}$ patterned as shown in FIG. 3. Thus, input terminal 12 is shown connected to the gate electrode $G_1$ of FET 1 by microstrip transmission line $T_1$, and transmission lines $T_2$, $T_3$, $T_4$ cascade interconnect gate electrodes $G_1$, $G_2$, $G_3$ and $G_4$ of FET 1 to FET 4. Also, the source contacts of the field effect transistors FET 1 to FET 4 are electrically connected together and to the ground plane 42 by conductors 43 passing through vias formed through the active region and semi-insulating gallium arsenide, as shown in FIG. 4 and described in my above-referenced patent application. It is also noted that the drain electrodes $D_1$ to $D_4$ are connected through transmission lines $T_5$ through $T_7$ and $T_{15}$ through $T_{18}$. It is further noted that the transmission line $T_8$ is used to couple the drain electrodes $D_1$ to $D_4$ of the transistors FET 1 to FET 4 to output terminal 14 through a capacitor $C_1$ and transmission line $T_9$. Here, capacitor $C_1$ is of conventional configuration having a bottom plate (not shown) disposed on the gallium arsenide substrate 40, a dielectric (not shown) disposed on such bottom plate, and a top plate 55 disposed on the dielectric 53, the top plate 53 being connected to the strip conductor $T_{S8}$ of transmission line $T_8$ and the bottom plate (not shown) being connected to the strip conductor $T_{S9}$ of transmission line $T_9$. It is also noted that a resistor $R_1$, here a titanium film resistor, is connected at one end to the gate $G_4$ of transistor FET 4 and at the other end to the top plate 57 of a capacitor $C_2$ through the strip conductor $T_{S10}$ of transmission line $T_{10}$. Here capacitor $C_2$ is formed in a manner equivalent to that of capacitor $C_1$, but here, however, the bottom plate 51 (FIG. 4) of such capacitor $C_2$ is connected to the source electrode $S_{4b}$ of FET 4 and to the ground plane conductor 42 by a via hole conductor 43 which passes through the gallium arsenide substrate 40. The top plate 57 of capacitor $C_2$ is connected to the strip conductor $T_{S11}$ of transmission line $T_{11}$ through a resistor $R_2$, which here is also a titanium film resistor. The strip conductor $T_{S11}$ of transmission line $T_{11}$ is connected to a top plate 63 of capacitor $C_3$, the bottom plate (not shown) of which is connected to the ground plane conductor 42 in a manner similar to that of capacitor $C_2$. The top plate 63 of capacitor $C_3$ is also connected to terminal 28 as shown.

Referring to the bottom portion of FIG. 3 and FIG. 5, the drain bias circuit 20 is shown, such circuit being shown wherein the strip conductor $T_{12s}$ of transmission line $T_{12}$ is connected to one end of resistor $R_3$, such end also being connected to the top plate 65 of capacitor $C_5$ through the strip conductor $T_{S13}$ of transmission line $T_{13}$. The second end of resistor $R_3$ is connected to the top plate 67 of capacitor $C_4$, and the top plate 65 of capacitor $C_5$ is connected to the top plate 69 of capacitor $C_6$ through the strip conductor $T_{S14}$ of transmission line $T_{14}$. Referring also to FIG. 5, it is noted that capacitors $C_4$ and $C_6$ share a common bottom plate 73 although, the top plates 67, 69 are electrically isolated one from the other by the dielectric 77 of the capacitors $C_4$, $C_6$. The common bottom plate 73 is electrically connected to the ground plane conductor 42 using a via hole 79 which passes through substrate 40, as shown. The top plate 69 of capacitor $C_6$ also is connected to terminal 24, as shown.

Referring to FIG. 6, a two-stage distributed amplifier 10' is shown, each one of such stages 10', 10" being identical in construction and similar to the distributed amplifier 10 referred to above in connection with FIGS. 1-5. It is noted that the constituents of the first stage 10' have been designated by the same designations as the constituents of amplifier 10 in FIG. 1 using a prime (') designation, and the constituents of the second stage 10" have been designated using a double prime (") indication. It is noted that the output of the first stage 10', i.e., the output of transmission line $T_9'$, is coupled to the input of the second stage, i.e., the input of transmission line $T_1''$. It is also noted that the gate electrode dc bias circuits 22', 22" are here T-networks and that the output of transmission lines $T_{11}'$ and $T_{11}''$ are connected together at terminal 90. Here capacitor $C_3'''$ is connected between such terminal 90 and ground to provide a low impedance path to radio frequency signals. It is noted, therefore, that both gate electrode dc bias circuits 22', 22" share a common capacitor, i.e., capacitor $C_3'''$. It is also noted that any radio frequency signals produced at the output of transmission line $T_{11}''$ are prevented from coupling back into the gate electrodes of the transistors FET 1' to FET 4' of the first stage 10' because of bypass capacitor $C_2'$. In like manner, any radio frequency signals produced at the output of transmission line $T_{11}'$ are prevented from coupling to the gate electrodes of the field effect transistors FET 1" to FET 4" of the second stage 10" by by-pass capacitor $C_2''$. It should also be noted that the dc drain bias circuits 20', 20" also share a common capacitor $C_6'''$ and that both circuits 20', 20" include resistors $R_3'$, $R_3''$ in series with the shunt capacitors $C_4'$, $C_4''$ so as to enable such resistors $R_3'$, $R_3''$ to provide in some measure a real component of the complex impedance of such drain bias circuits 20', 20" while being disposed in such manner that dc drain current will not pass through such resistors R₃', R₃" and thereby dissipate unnecessarily dc power.

Figure 7:
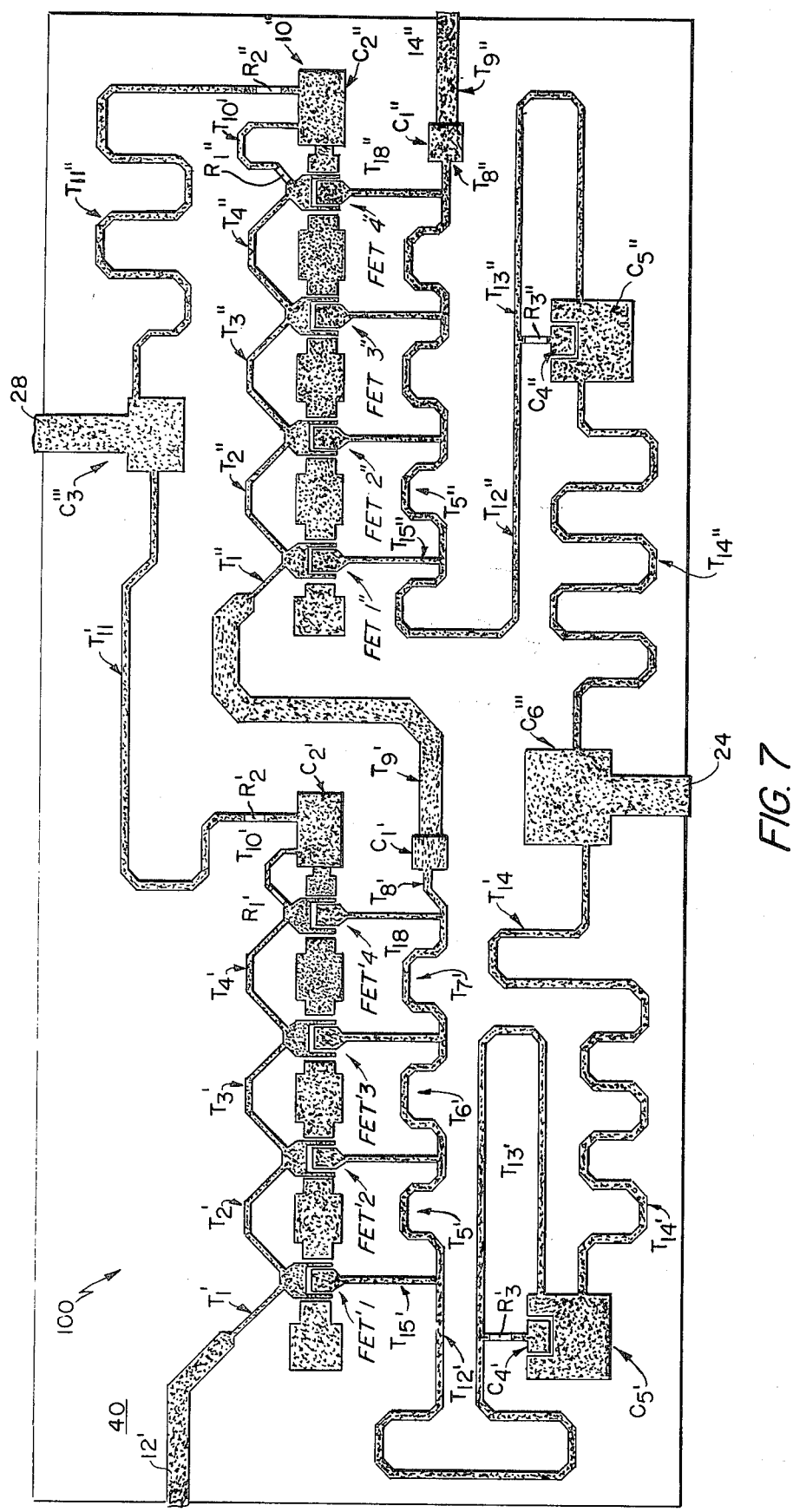
FIG. 7 is a plan view of a monolithic integrated circuit of the distributed amplifier of FIG. 6.

Referring now to FIG. 7, distributed amplifier 100 is shown as a monolithic integrated circuit, such amplifier being formed on a gallium arsenide substrate 40 with constituent parts thereof being designated by the same designation as corresponding parts shown in the schematic of FIG. 6.

Having described preferred embodiments of this invention, it is now evident that other embodiments incorporating its concepts will become readily apparent to one of skill in the art. It is felt, therefore, that this invention should not be restricted to its disclosed embodiments, but rather should be limited only by the spirit and scope of the appended claims.

What is claimed is:

1. In combination:
   (a) a plurality of successively coupled transistors, each one thereof having an input electrode, an output electrode, and a grounded electrode, a first one of such transistors having the input electrode thereof coupled to an input terminal and a last one of such transistors having the output electrode thereof coupled to an output terminal;
   (b) means for interconnecting said input electrodes; and
   (c) means, coupled to the output electrodes of the plurality of transistors, for coupling a grounded bias voltage source to the plurality of output electrodes through a direct current path and including a resistor coupled in shunt between ground and the direct current path.

2. The combination recited in claim 1 wherein the bias voltage coupling means includes a transmission line disposed in the direct current path.

3. The combination recited in claim 2 wherein the bias voltage coupling means includes a capacitor serially coupled to the resistor in the shunt path between the direct current path and ground.

4. A distributed amplifier, comprising:
   (a) means, including a plurality of successively coupled field effect transistors having cascade interconnected gate electrodes, cascade interconnected drain electrodes, and grounded source electrodes, a first one of such transistors having the gate electrode thereof coupled to an input terminal adapted to receive a radio frequency signal and the last one of the successively coupled transistors having the drain electrode thereof coupled to an output terminal for producing an amplified radio frequency signal; and,
   (b) drain bias circuit means connected to the drain electrodes of the transistors for coupling a grounded drain electrode bias voltage source to the drain electrodes through a series direct current path, and including a capacitor serially coupled to a resistor and coupled in shunt between the direct current path and ground.

5. The distributed amplifier recited in claim 4 including, additionally, a gate bias circuit means connected to the gate electrodes of the transistors for coupling a gate electrode bias voltage source to the gate electrodes of the transistors.

6. The distributed amplifier recited in claim 5 including a resistor disposed in a series path between the gate electrode bias voltage source and the gate electrodes.

7. The distributed amplifier recited in claim 6 wherein the gate bias circuit means includes a capacitor disposed between the series path and ground.

8. The distributed amplifier recited in claim 7 wherein the gate bias circuit means includes a radio frequency transmission line disposed in the series path.

9. The distributed amplifier recited in claim 8 including a plurality of transmission lines for successively coupling the plurality of field effect transistors.

10. The distributed amplifier recited in claim 9 wherein the drain bias circuit means includes a transmission line in the direct current path.

* * * * *